United States Patent
So et al.

(10) Patent No.: US 6,781,196 B2
(45) Date of Patent: Aug. 24, 2004

(54) TRENCH DMOS TRANSISTOR HAVING IMPROVED TRENCH STRUCTURE

(75) Inventors: Koon Chong So, Fremont, CA (US); Fwu-Iuan Hshieh, Saratoga, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/094,932

(22) Filed: Mar. 11, 2002

(65) Prior Publication Data

US 2003/0168696 A1 Sep. 11, 2003

(Under 37 CFR 1.47)

(51) Int. Cl.[7] .......................... H01L 29/76; H01L 29/94; H01L 31/062; H01L 31/113; H01L 31/119
(52) U.S. Cl. ...................... 257/329; 257/327; 257/328; 257/330; 257/331; 257/332
(58) Field of Search ................................ 257/327–335

(56) References Cited

U.S. PATENT DOCUMENTS

| | | | |
|---|---|---|---|
| 5,072,266 A | | 12/1991 | Bulucea et al. ............. 357/23.4 |
| 5,541,425 A | | 7/1996 | Nishihara .................... 257/139 |
| 5,656,843 A | * | 8/1997 | Goodyear et al. ........... 257/329 |
| 5,744,826 A | * | 4/1998 | Takeuchi et al. ............... 257/77 |
| 5,770,878 A | * | 6/1998 | Beasom ....................... 257/330 |
| 5,866,931 A | | 2/1999 | Bulucea et al. ............. 257/331 |
| 6,107,661 A | | 8/2000 | Okabe et al. ................ 257/330 |
| 6,133,587 A | * | 10/2000 | Takeuchi et al. ............... 257/77 |
| 6,215,149 B1 | * | 4/2001 | Lee et al. .................... 257/328 |
| 6,525,373 B1 | * | 2/2003 | Kim ............................ 257/330 |
| 2003/0062570 A1 | * | 4/2003 | Darwish et al. ............. 257/330 |
| 2003/0127688 A1 | * | 7/2003 | Mo et al. ..................... 257/335 |

FOREIGN PATENT DOCUMENTS

| | | | | |
|---|---|---|---|---|
| EP | 0 580 213 A1 | 1/1994 | ......... | H01L/29/784 |
| EP | 0 594 177 A1 | 4/1994 | ......... | H01L/29/784 |
| EP | 0 666 590 A2 | 8/1995 | ......... | H01L/21/336 |
| JP | 58176974 | 10/1983 | ........... | H01L/29/78 |
| JP | 04326766 | 11/1992 | ......... | H01L/29/784 |
| JP | 09153614 | 6/1997 | ........... | H01L/29/78 |
| JP | 9213951 | * 8/1997 | ................ | 257/334 |

* cited by examiner

Primary Examiner—Jerome Jackson
Assistant Examiner—Jesse A. Fenty
(74) Attorney, Agent, or Firm—Mayer Fortkort & Williams, PC; Stuart H. Mayer, Esq.; Karin L. Williams, Esq.

(57) ABSTRACT

A trench DMOS transistor cell is provided that includes a substrate of a first conductivity type and a body region located on the substrate, which has a second conductivity type. At least one trench extends through the body region and the substrate. An insulating layer lines the trench and a conductive electrode is placed in the trench overlying the insulating layer. A source region of the first conductivity type is located in the body region adjacent to the trench. The trench has sidewalls that define a polygon in the plane of the substrate so that adjacent sidewalls contact one another at an angle greater than 90 degrees.

14 Claims, 8 Drawing Sheets

US 6,781,196 B2

TRENCH DMOS TRANSISTOR HAVING IMPROVED TRENCH STRUCTURE

STATEMENT OF RELATED APPLICATIONS

The present invention is related to U.S. application Ser. No. 09/395,832, entitled "Trench DMOS Transistor Having Improved Trench Structure," filed in the United States Patent and Trademark Office Sep. 14, 1999, now abandoned.

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use diffusion to form the transistor regions. DMOS transistors are typically employed as power transistors to provide high voltage circuits for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541,425, and 5,866,931.

One important characteristic determining the quality of a DMOS transistor is the leakage current that arises between the polysilicon gate and the substrate. This current, which adversely affects the performance of the device, depends in part on the breakdown voltage of the gate oxide layer that lines the trench. Unfortunately, since adjacent sidewalls of the trench typically meet at a sharp corner, i.e., a 90 degree angle, large electric fields arise between the polysilicon and the substrate. These electric fields, in turn, greatly reduce the breakdown voltage of the gate oxide layer, thus increasing the leakage current of the device.

Accordingly, there is a need for a trench DMOS transistor that has a gate oxide layer with an increased breakdown voltage.

SUMMARY OF THE INVENTION

The present invention provides a trench DMOS transistor cell that includes a substrate of a first conductivity type and a body region located on the substrate, which has a second conductivity type. At least one trench extends through the body region and the substrate. An insulating layer lines the trench and a conductive electrode is placed in the trench overlying the insulating layer. A source region of the first conductivity type is located in the body region adjacent to the trench. The trench has sidewalls that define a polygon in the plane of the substrate so that adjacent sidewalls contact one another at an angle greater than 90 degrees.

In accordance with another aspect of the invention, the polygon defined by the trench sidewalls is a hexagon and angle formed by adjacent sidewalls is equal to 135 degrees.

In accordance with another aspect of the invention, the trench has a generally rectangular cross-sectional shape in at least two orthogonal planes. The DMOS transistor cell also includes a drain electrode disposed on a surface of the substrate opposing the body region.

In accordance with another aspect of the invention, the insulating layer may be an oxide layer and the conductive electrode may include polysilicon.

In accordance with yet another aspect of the invention, the polysilicon forming the conductive electrode includes a layer of undoped polysilicon and a layer of doped polysilicon.

In accordance with another embodiment of the invention, the rounded corners of the trench sidewalls have a radius of curvature about equal to the width of the trench.

DETAILED DESCRIPTION

Figures 1, 2, 3:
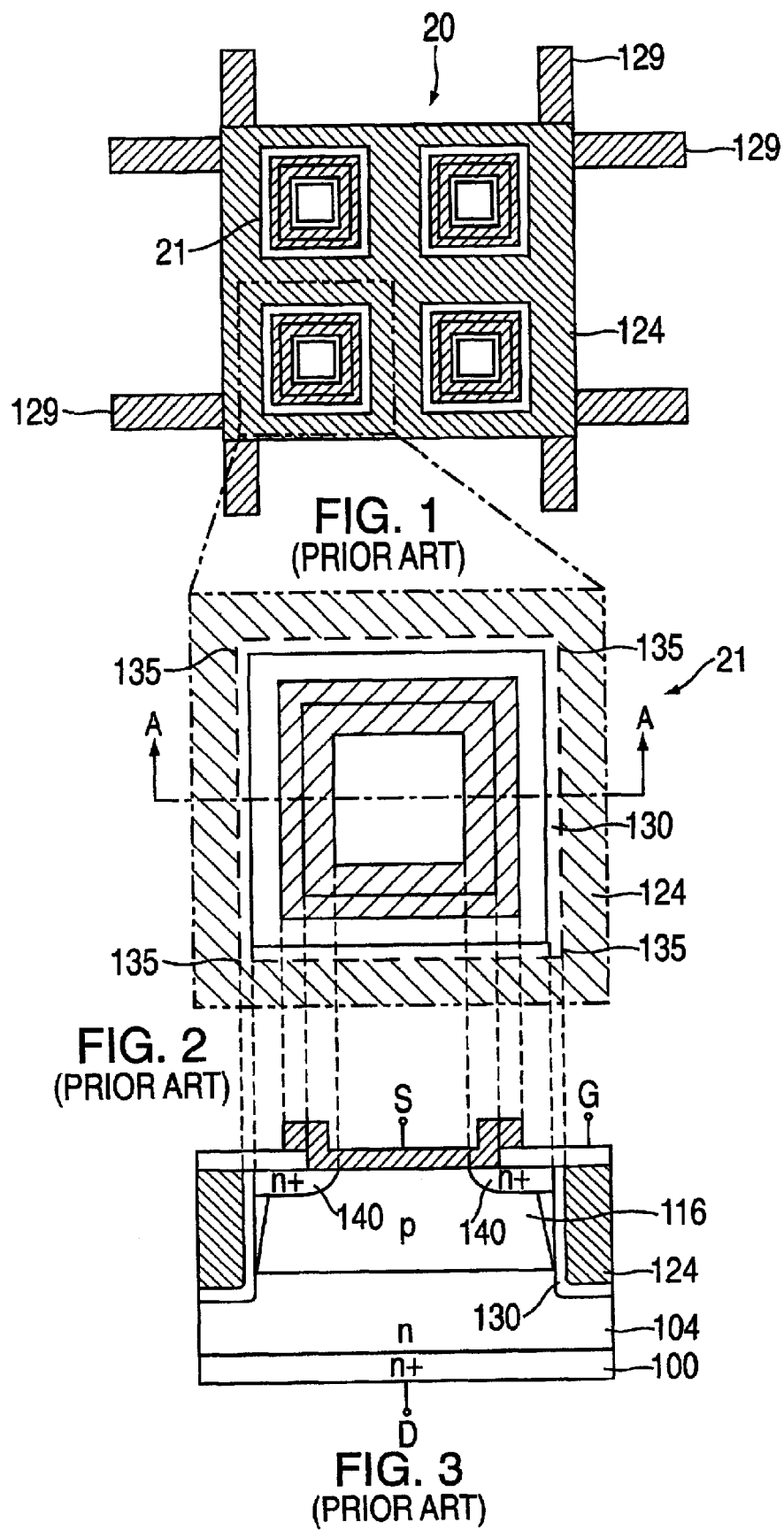
FIG. 1 shows a plan view of a conventional DMOS transistor.
FIG. 2 shows an enlarged plan view illustrating an individual cell in the conventional transistor of FIG. 1.
FIG. 3 shows a schematic cross-sectional view of the DMOS transistor shown in FIGS. 1–2 taken along line A–A' of FIG. 2.

FIGS. 1–3 illustrate one embodiment of a conventional trench DMOS structure 20 in which the individual cells 21 are rectangular in shape in a horizontal cross-section. The structure includes, in this embodiment, an n+ substrate 100 on which is grown a lightly n-doped epitaxial layer 104. Within doped epitaxial layer 104, a body region 116 of opposite conductivity is provided. An n-doped epitaxial layer 140 that overlies most of the body region 116 serves as the source. A rectangularly shaped trench 124 is provided in the epitaxial layers, which is open at the upper surface of the structure and defines the perimeter of the transistor cell. A gate oxide layer 130 lines the sidewalls of the trench 124. The trench 124 is filled with polysilicon, i.e., polycrystalline silicon. A drain electrode is connected to the back surface of the semiconductor substrate 100, a source electrode is connected to the two source regions 140 and the body region 116, and a gate electrode is connected to the polysilicon that fills the trench 124. As seen in FIG. 1, the polysilicon lining trenches 124 is continuously connected over the surface of structure 20. In addition, polysilicon contacts 129 extend beyond the surface of structure 20 to serve as interconnects.

As indicated, the MOSFET shown in FIG. 1 has its gate positioned in a vertically oriented trench. This structure is often called a trench vertical DMOSFET. It is "vertical" because the drain contact appears on the back or underside of the substrate and because the channel flow of current from source to drain is approximately vertical. This minimizes the higher resistance associated with bent or curved current paths or with parasitic field effect construction. The device is also doubly diffused (denoted by the prefix "D") because the source region is diffused into the epitaxial material on top of a portion of the earlier-diffused body region of opposite conductivity type. This structure uses the trench side wall area for current control by the gate and has a substantially vertical current flow associated with it. As previously mentioned, this device is particularly appropriate for use as a power switching transistor where the current carried through a given transverse silicon area is to be maximized.

It should be noted that the transistor cell 21 need not have a rectangular shape for basic transistor operation, but more generally may have any polygonal shape. However, a regular rectangular shape and a regular hexagonal shape are the most convenient for layout purposes. Alternatively, rather than having a closed-cell geometry as depicted in the figures, the transistor cell may have an open or stripe geometry. Examples of various transistor cell geometries are shown in the previously mentioned references.

As previously mentioned, the integrity of the gate oxide layer 130 that lines the trench 124 is an important characteristic defining the quality of the transistor cell 21. Unfortunately, the sharp corners 135 of the trench in the horizontal plane gives rise to a large electric field between the polysilicon filling the trench and the substrate. As a result, the breakdown voltage of the gate oxide layer 130 is greatly reduced in the vicinity of the trench corner 135.

Figure 4:
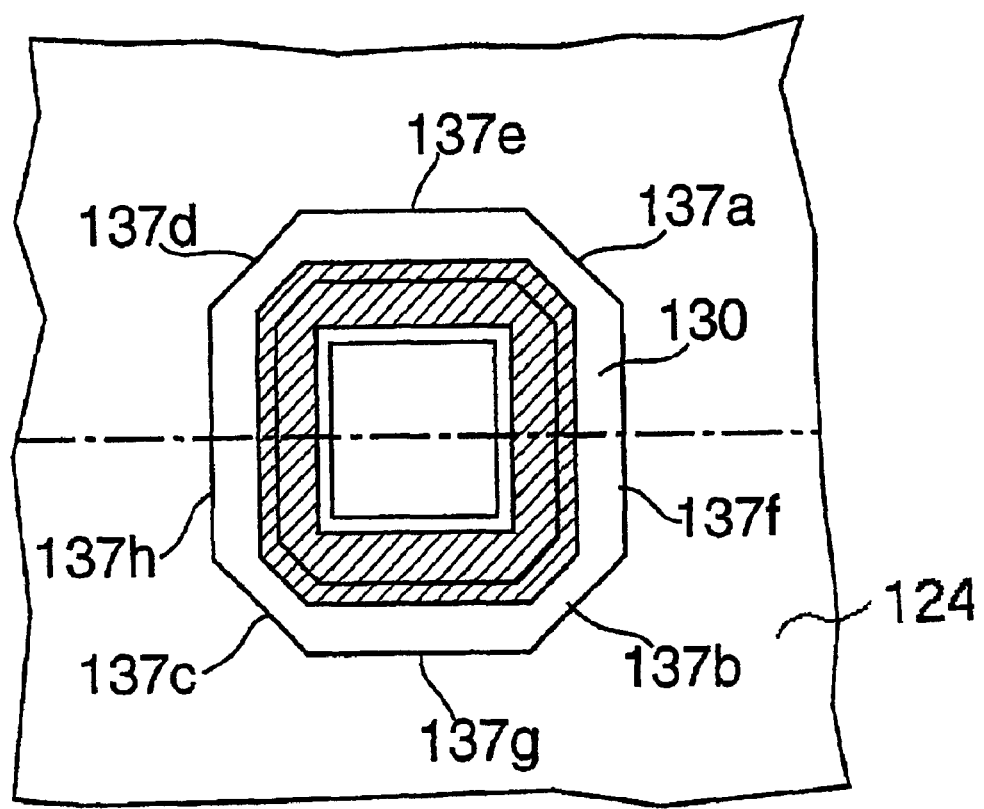
FIG. 4 shows a plan view of a DMOS transistor cell constructed in accordance with the present invention.

In accordance with the present invention, the integrity of the gate oxide layer 130 is improved by making sharp corners of the trench blunt. In the square cell of FIG. 4 the corners are advantageously made blunt by replacing the 90 degree corner angle of the trench sidewall with a short linear segment that makes a 135 degree angle with both contiguous linear segments. For example, segment 137a makes a 135 degree angle with segments 137e and 137f; segment 137b makes a 135 degree angle with segment 137g and 137f, segment 137c makes a 135 degree angle with segments 137g and 137h; and segment 137d makes a 135 degree angle with segments 137h and 137e. That is, as shown in FIG. 4., the trench sidewalls extending vertically through the substrate are arranged so that adjacent sidewalls do not contact one another in an orthogonal manner. Rather, the trench sidewalls define a hexagonal shape. By blunting the corners of the trench in this way, the concentration of the electric field is reduced in the vicinity of the corners, advantageously increasing the breakdown voltage of the device. In some embodiments of the invention, the trench sidewalls may employ additional sidewalls than shown in FIG. 4 so that adjacent sidewalls form an angle of less than 135 degree, but more than 90 degrees.

Figure 5:
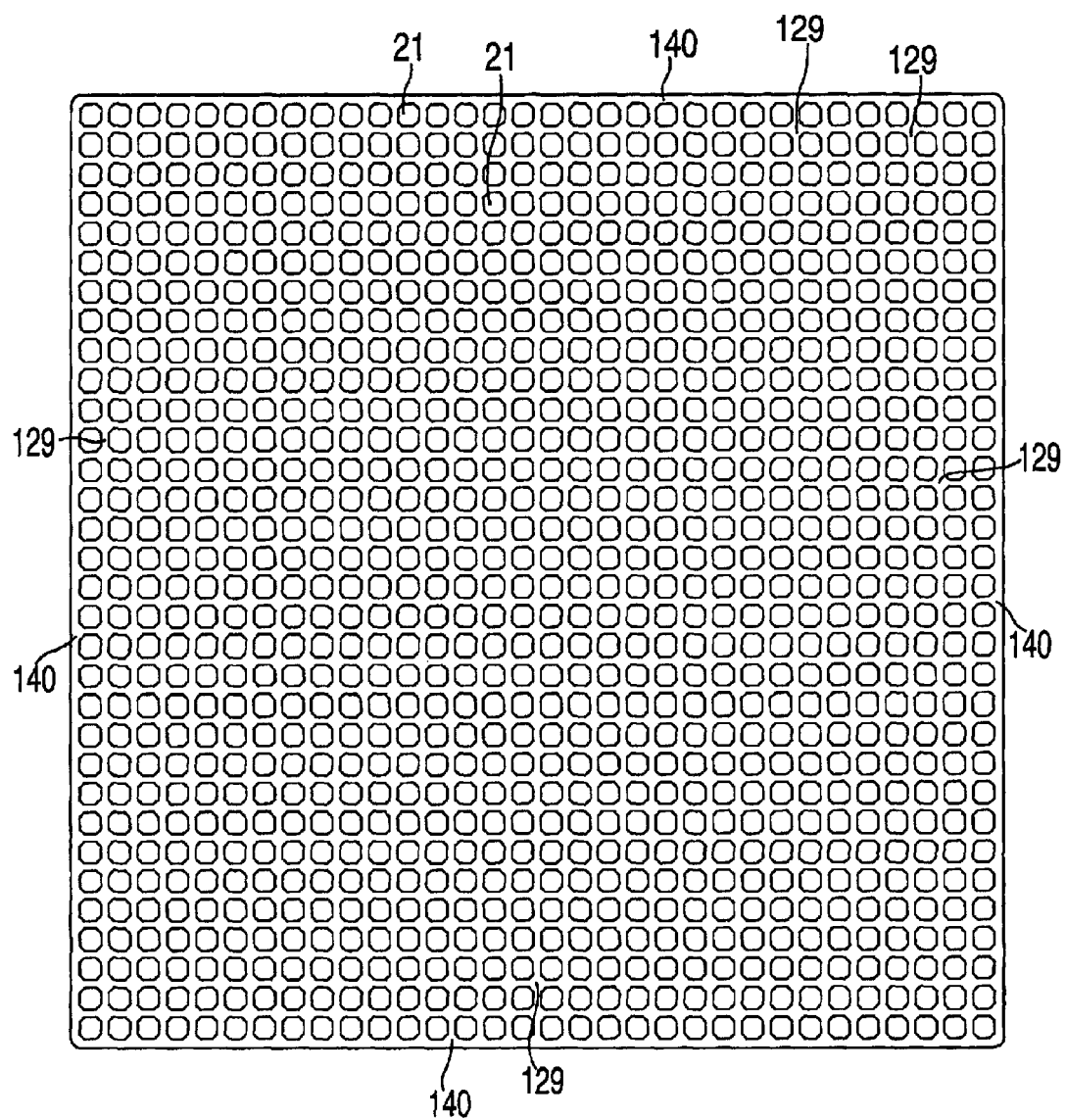
FIG. 5 an alternative embodiment of the DMOS transistor shown in FIG. 4.

FIG. 5 shows an alternative embodiment of the invention in which an additional polysilicon trench 140 is provided around the periphery of the transistor, interconnecting the contacts 129 depicted in FIG. 1. This additional polysilicon trench effectively serves as a guard ring to reduce the electric field that would otherwise arise from the sharp corners of contacts 129. The corners of polysilicon trench 140 are blunted in the manner shown in FIG. 4 by imparting to them a hexagonal shape.

Figure 7:
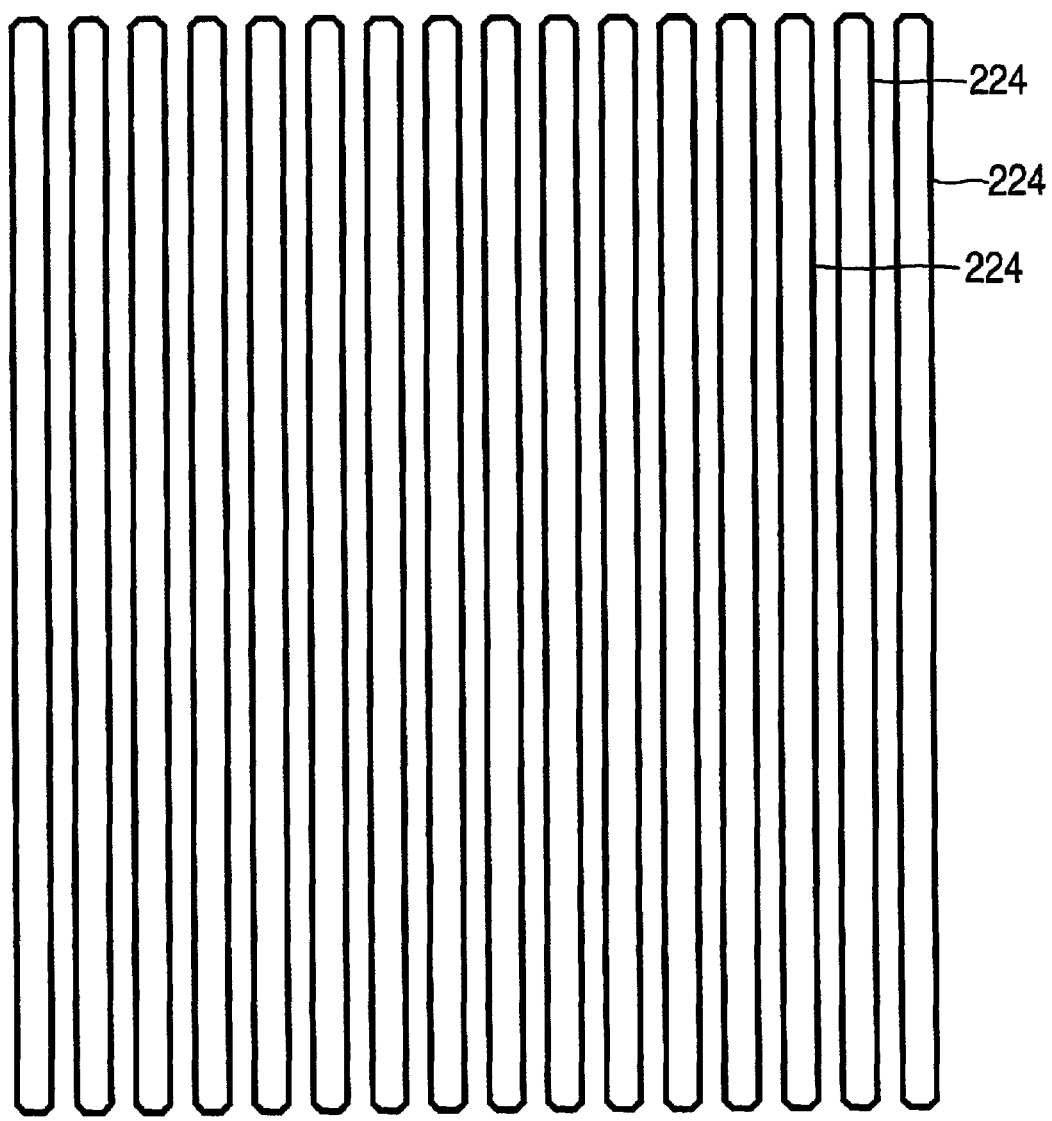
FIG. 7 shows a plan view of a DMOS transistor structure having an open cell geometry constructed in accordance with the present invention.
Figure 8:
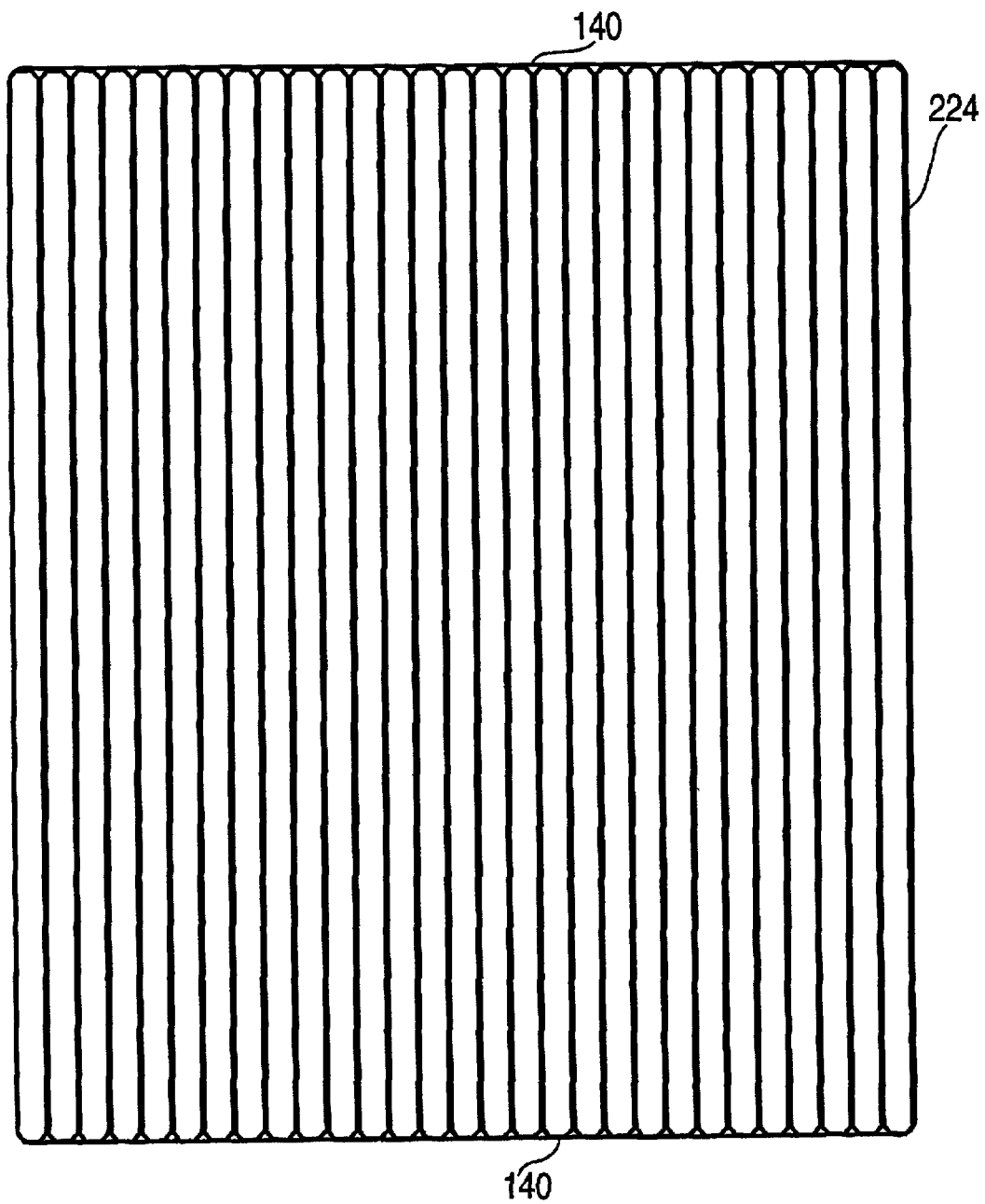
FIG. 8 shows a plan view of an alternative embodiment of a DMOS transistor structure having an open cell geometry constructed in accordance with the present invention.

As previously mentioned, the transistor cells 21 may have a closed-cell geometry such as shown in FIGS. 1–5 or, alternatively, an open or strip geometry. FIG. 7 shows a plan view of a trench DMOS structure having an open geometry in which the sharp corners of the trenches 224 are blunted in accordance with the present invention. FIG. 8 shows a structure with an open cell geometry that includes a trench guard ring such as depicted in FIG. 5.

The inventive DMOS device shown in FIGS. 4–5 may be fabricated in accordance with any conventional processing technique. Moreover, one exemplary technique, disclosed in co-pending patent application entitled "Trench DMOS Transistor Having Reduced Punch-Through" and filed on even date herewith, is discussed below. However, it should be understood that the fabrication of the present invention is not limited to this technique, which is presented only by way of illustration.

Figure 6A:
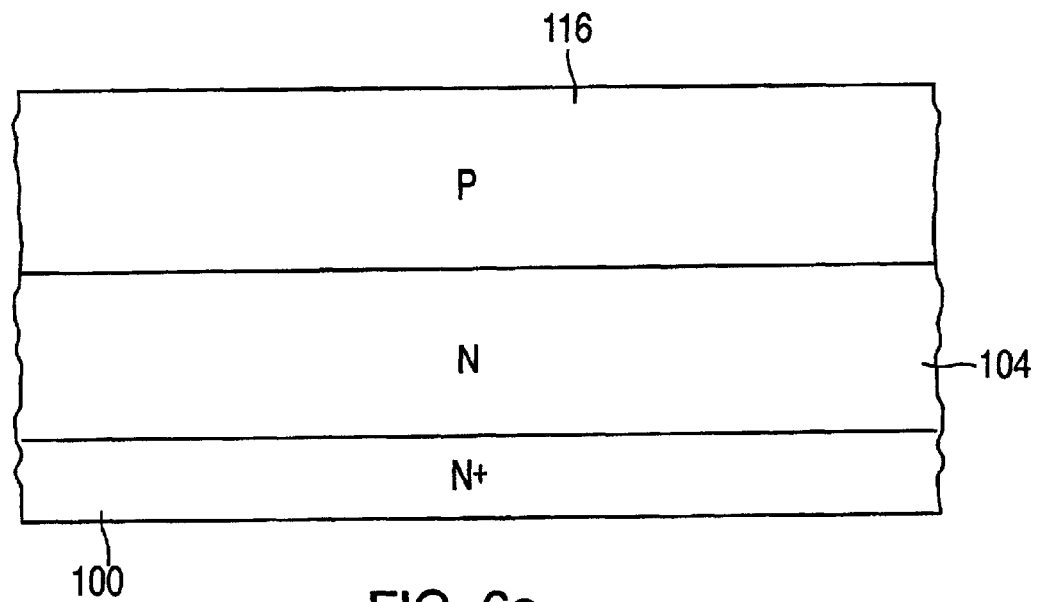
FIGS. 6(a)–6(f) illustrate a sequence of process steps forming the DMOS transistor of FIGS. 4–5.

FIGS. 6(a)–6(f) show a series of exemplary steps that are performed to form the DMOS device depicted in FIG. 4. In FIG. 6(a), an N− doped epitaxial layer 104 is grown on a conventionally N+ doped substrate 100. Epitaxial layer 104 is typically 5.5 microns in thickness for a 30 V device. Next, P-body region 116 is formed in an implantation and diffusion step. Since the P-body implant is uniform across the substrate, no mask is needed. The P-body regions are boron implanted at 40 to 60 KEV with a dosage of about $5.5 \times 10^{13}/cm^3$.

Figure 6B:
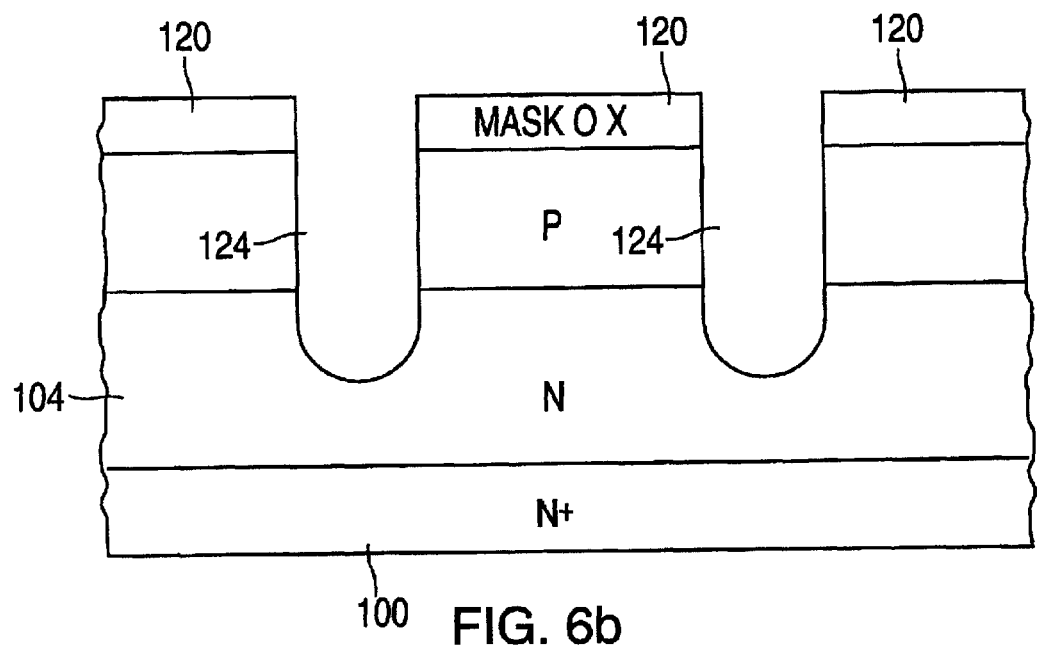

In FIG. 6(b), a mask layer is formed by covering the surface of epitaxial layer 104 with an oxide layer, which is then conventionally exposed and patterned to leave mask portions 120. Mask portions 120 are used for defining the location of the trenches. The patterned mask portions 120 define the blunted trench sidewalls depicted in FIG. 4. Trenches 124 are dry etched through the mask openings by reactive ion etching to a depth that typically ranges from 1.5 to 2.5 microns.

Figure 6C:
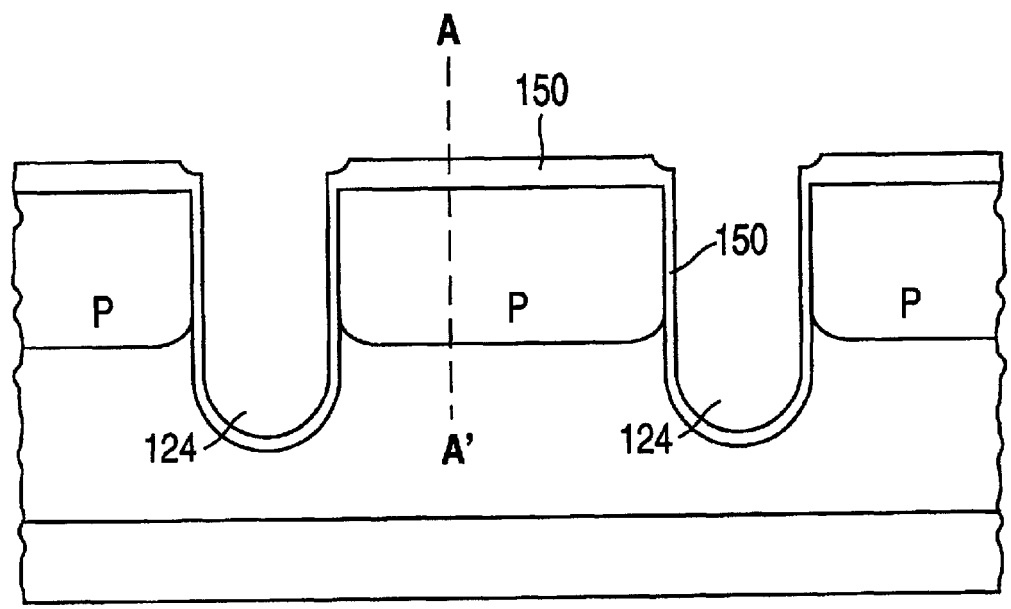

In FIG. 6(c), the sidewalls of each trench are smoothed. First, a dry chemical etch may be used to remove a thin layer of oxide (typically about 500–1000 A) from the trench sidewalls to eliminate damage caused by the reactive ion etching process. Next, a sacrificial silicon dioxide layer 150 is grown over trenches 124 and mask portions 120. The sacrificial layer 150, as well as mask portions 120, are removed either by a buffer oxide etch or an HF etch so that the resulting trench sidewalls are as smooth as possible.

Figure 6D:
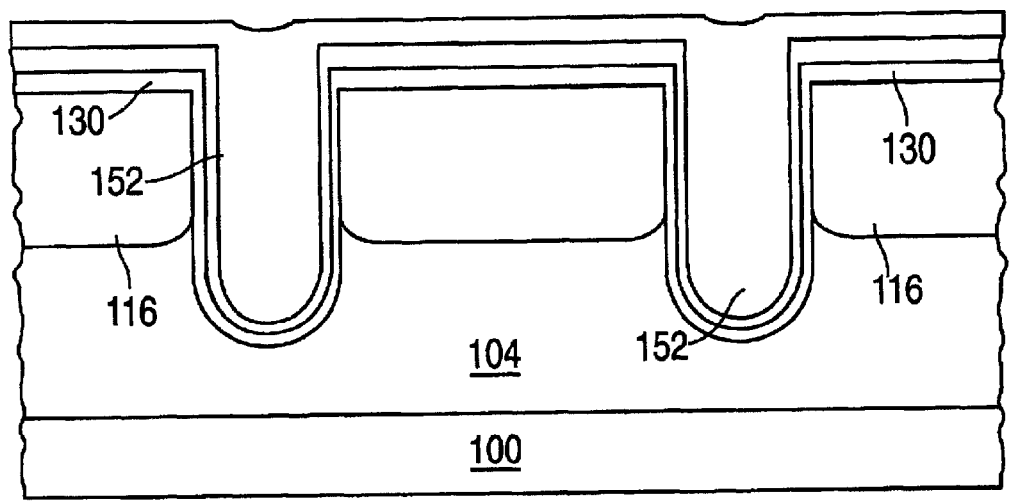

As shown in FIG. 6(d), the gate oxide layer 130 is then deposited on the entire structure so that it covers the trench walls and the surface of p-body 116. Gate oxide layer 130 typically has a thickness in the range of 500–800 angstroms. Next, the trenches 124 are filled with polysilicon 152, i.e., polycrystalline silicon. Prior to deposition, the polysilicon is typically doped with phosphorous chloride or implanted with arsenic or phosphorous to reduce its resistivity, typically within the range of 20 Ω/m. In some embodiments of the invention the polysilicon may be deposited in a two step process. In the first step, a layer of undoped polysilicon is deposited to line the sidewalls of the trenches. The undoped polysilicon layer is followed by the deposition of a layer of doped polysilicon. Typically, the thickness of the doped polysilicon layer is greater than the thickness of the undoped polysilicon layer. For example, the ratio of the thickness of the doped polysilicon layer to the undoped polysilicon layer may be 7:1, with a total thickness of about 8,000 A. The undoped polysilicon layer is advantageously employed as a buffer layer inhibits the penetration of dopant material through the gate oxide layer and into the p-body, thus further reducing punch-through.

Figure 6E:
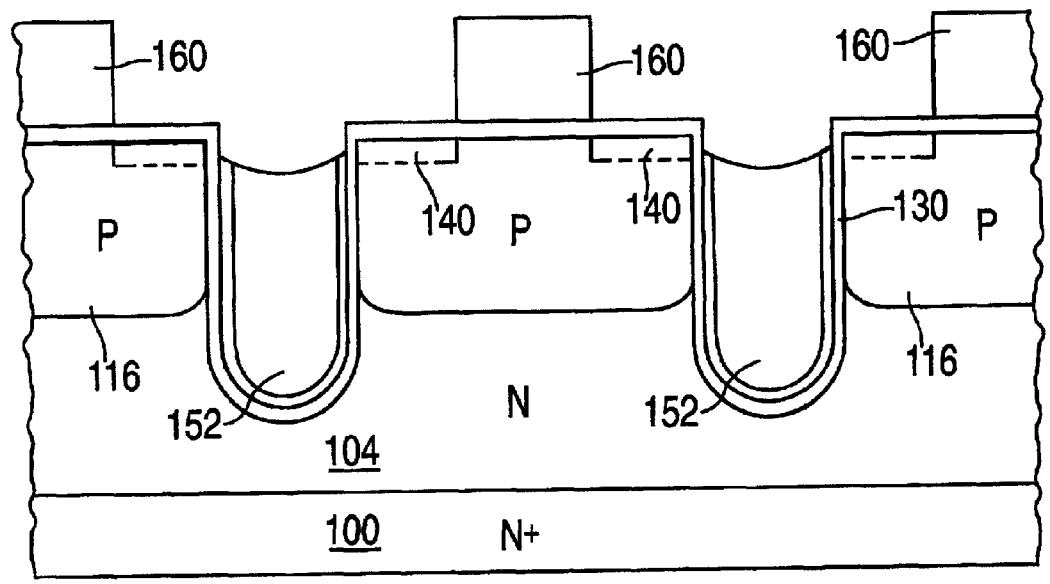
Figure 6F:
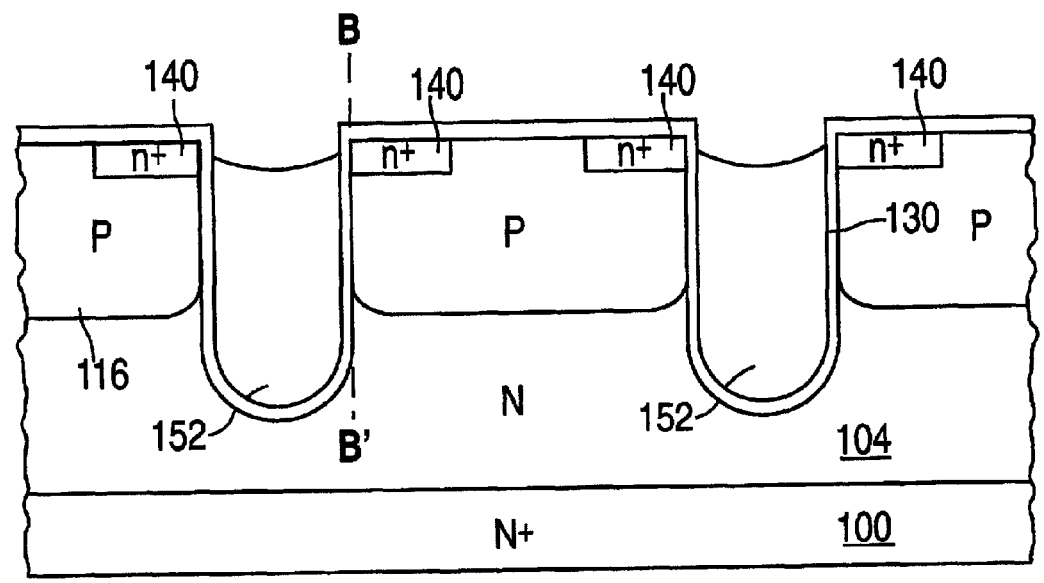

In FIG. 6(e), the polysilicon layer 152 is etched to optimize its thickness and to expose the portion of the gate oxide layer 130 that extends over the surface of p-body 116. Next, a photoresist masking process is used to form patterned masking layer 160. Patterned masking layer 160 defines source regions 140. Source regions 140 are then formed by an implantation and diffusion process. For example, the source regions may be implanted with arsenic at 80 KeV to a concentration that is typically in the range of $8 \times 10^{15}$ to $1.2 \times 10^{16}$. After implantation, the arsenic is diffused to a depth of approximately 0.5 microns. Finally, masking layer 160 is removed in a conventional manner to form the structure depicted in FIG. 6(f).

The trench DMOS transistor is completed in a conventional manner by forming and patterning a BPSG layer over the structure to define BPSG regions associated with the source and gate electrodes. Also, a drain contact layer is formed on the bottom surface of the substrate. Finally, a pad mask is used to define pad contacts.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is claimed is:

1. A trench DMOS transistor structure that includes a plurality of individual trench DMOS transistor cells formed on a substrate of a first conductivity type, each of said individual trench DMOS transistor cells comprising:

a body region on the substrate, said body region having a second conductivity type;

at least one trench extending through the body region and the substrate;

an insulating layer that lines the trench;

a conductive electrode in the trench overlying the insulating layer;

a source region of the first conductivity type in the body region adjacent to the trench;

a plurality of polysilicon contacts respectively connected to transistor cells located along the periphery of the structure; and a polysilicon trench guard ring coupling together said plurality of polysilicon contacts, wherein said trench has sidewalls that define a polygon in the plane of the substrate so that adjacent sidewalls contact one another at an angle greater than 90 degrees, and wherein the sidewalls comprise at least a first pair of parallel sidewalls and a second pair of parallel sidewalls, the first pair of parallel sidewalls lying in a first plane, and the second pair of parallel sidewalls lying in a second plane, the first and second planes at right angles to each another, wherein the first pair of parallel sidewalls and the second pair of parallel sidewalls do not directly contact one another.

2. The DMOS transistor structure of claim 1 further comprising a drain electrode disposed on a surface of the substrate opposing the body region.

3. The DMOS transistor structure of claim 1 wherein said insulating layer is an oxide layer.

4. The DMOS transistor structure of claim 1 wherein said conductive electrode includes polysilicon.

5. The DMOS transistor structure of claim 4 wherein said polysilicon includes a dopant material.

6. The DMOS transistor structure of claim 4 wherein said polysilicon includes a layer of undoped polysilicon and a layer of doped polysilicon.

7. The DMOS transistor structure of claim 6 wherein said polygon is an octagon and said angle is equal to 135 degrees.

8. The DMOS transistor structure of claim 1 wherein at least one of said trench DMOS transistor cells have a closed cell geometry.

9. The DMOS transistor structure of claim 8 further comprising a plurality of polysilicon contacts respectively connected to transistor cells located along the periphery of the structure.

10. The DMOS transistor structure of claim 9 further comprising a polysilicon trench guard ring coupling together said plurality of polysilicon contacts.

11. The DMOS transistor structure of claim 1 wherein at least one of said trench DMOS transistor cells have an open cell geometry.

12. The DMOS transistor structure of claim 11 further comprising a plurality of polysilicon contacts respectively connected to transistor cells located along the periphery of the structure.

13. The DMOS transistor structure of claim 12 further comprising a polysilicon trench guard ring coupling together said plurality of polysilicon contacts.

14. The DMOS transistor structure of claim 1 wherein said polygon is an octagon and said angle is equal to 135 degrees.

* * * * *

UNITED STATES PATENT AND TRADEMARK OFFICE
CERTIFICATE OF CORRECTION

PATENT NO. : 6,781,196 B2 Page 1 of 1
APPLICATION NO. : 10/094932
DATED : August 24, 2004
INVENTOR(S) : Koon Chong So et al.

It is certified that error appears in the above-identified patent and that said Letters Patent is hereby corrected as shown below:

Col. 1, Line 1, after "U.S.", change "application" to -- Application --.

Col. 3, Line 15, before "area", change "side wall" to -- sidewall --.

Col. 4, Line 26, after "V", change "device ." to -- device. --.

Col. 5, Line 2, after "buffer", change "layer inhibits" to -- layer, inhibiting --.

Col. 6, Line 10, Claim 1 after "each", change "another" to -- other --.

Signed and Sealed this

Fourth Day of December, 2007

JON W. DUDAS
*Director of the United States Patent and Trademark Office*